United States Patent
Hawryluk et al.

(10) Patent No.: US 10,847,381 B2
(45) Date of Patent: Nov. 24, 2020

(54) LASER ANNEALING SYSTEMS AND METHODS WITH ULTRA-SHORT DWELL TIMES

(71) Applicant: Veeco Instruments Inc., Plainview, NY (US)

(72) Inventors: Andrew M. Hawryluk, Los Altos, CA (US); Serguei Anikitchev, Hayward, CA (US)

(73) Assignee: Veeco Instruments Inc., Plainview, NY (US)

( * ) Notice: Subject to any disclaimer, the term of this patent is extended or adjusted under 35 U.S.C. 154(b) by 226 days.

(21) Appl. No.: 16/106,850

(22) Filed: Aug. 21, 2018

(65) Prior Publication Data

US 2019/0006189 A1 Jan. 3, 2019

Related U.S. Application Data

(62) Division of application No. 14/941,712, filed on Nov. 16, 2015, now Pat. No. 10,083,843.

(60) Provisional application No. 62/092,925, filed on Dec. 17, 2014.

(51) Int. Cl.
*H01L 21/324* (2006.01)
*H01L 21/02* (2006.01)
*H01L 21/67* (2006.01)
*H01L 21/268* (2006.01)

(52) U.S. Cl.
CPC .......... *H01L 21/324* (2013.01); *H01L 21/268* (2013.01); *H01L 21/67115* (2013.01); *H01L 21/67248* (2013.01)

(58) Field of Classification Search
CPC ................................................ H01L 21/02675
See application file for complete search history.

(56) References Cited

U.S. PATENT DOCUMENTS

| | | | | |
|---|---|---|---|---|
| 8,309,474 B1* | 11/2012 | Wang | ................ | H01L 21/02678 438/166 |
| 8,546,805 B2* | 10/2013 | Shen | ...................... | H01L 22/12 257/57 |
| 8,865,603 B2* | 10/2014 | Hawryluk | .......... | B23K 26/0006 438/795 |
| 2011/0298093 A1* | 12/2011 | Zafiropoulo | ....... | B23K 26/0608 257/618 |
| 2012/0100728 A1* | 4/2012 | Anikitchev | ............ | B23K 26/55 438/795 |
| 2013/0330844 A1* | 12/2013 | Hawryluk | .......... | B23K 26/0648 438/5 |
| 2014/0097171 A1* | 4/2014 | Wang | ..................... | B23K 26/18 219/385 |

* cited by examiner

*Primary Examiner* — Geoffrey S Evans
(74) *Attorney, Agent, or Firm* — Downs Rachlin Martin PLLC

(57) ABSTRACT

Laser annealing systems and methods with ultra-short dwell times are disclosed. The method includes locally pre-heating the wafer with a pre-heat line image and then rapidly scanning an annealing image relative to the pre-heat line image to define a scanning overlap region that has a dwell time is in the range from 10 ns to 500 ns. These ultra-short dwell times are useful for performing surface or subsurface melt annealing of product wafers because they prevent the device structures from reflowing.

14 Claims, 5 Drawing Sheets

LASER ANNEALING SYSTEMS AND METHODS WITH ULTRA-SHORT DWELL TIMES

RELATED APPLICATION DATA

This application is a divisional of U.S. patent application Ser. No. 14/941,712, filed on Nov. 16, 2015, now U.S. Pat. No. 10,083,843, entitled "Laser Annealing Systems and Methods With Ultra-Short Dwell Times," which application claims priority to U.S. Provisional Patent Application Ser. No. 62/092,925, filed Dec. 17, 2014, entitled "Laser Annealing Systems and Methods With Ultra-Short Dwell Times," each of which is incorporated by reference herein in its entirety.

FIELD OF THE INVENTION

The present disclosure relates generally to annealing as used in semiconductor manufacturing to fabricate integrated circuits and memory devices, and in particular relates to laser annealing systems and methods with ultra-short dwell times.

Any and all references cited herein are incorporated by reference herein, including: U.S. Pat. Nos. 8,309,474; 8,546,805; 8,865,603; and U.S. patent application Ser. No. 14/497,006.

BACKGROUND

Conventional nanosecond pulsed-laser melt annealing ("conventional melt laser annealing") offers an ultra-low thermal budget, high dopant activation and super-abrupt junctions that are ideal for advanced integrated circuit (IC) chip fabrication. In practice, however, it is difficult to implement this type of annealing on patterned wafers due to large temperature non-uniformities that can arise from spatial variations in the optical and thermal properties of the IC chip. These adverse effects are referred to in the art as "pattern density effects."

U.S. Pat. No. 8,309,474 describes a technique where a first scanned laser beam is used to pre-heat a substrate to near-melt conditions in a uniform manner using a hybrid melt/non-melt apparatus. A second laser that emits a light beam with light pulses is then used to bring the annealed region up to the melt temperate for a short period that allows the melted region to recrystalize quickly. An advantage of this approach is that the temperature non-uniformity from the pulsed laser interacting with the patterned substrate is significantly mitigated. However, this approach suffers from pulse-to-pulse repeatability requirements and pulsed laser image uniformity constraints, and also has a relatively long dwell time in the range of 100 microseconds to 20 milliseconds that exacerbates the above-mentioned issues.

U.S. Pat. No. 8,865,603 describes an annealing system wherein a scanning continuous wave (CW) laser beam is used to perform backside laser processing with dwell times in the range from 1 microseconds to 100 microseconds. The advantage of this approach is that the beam stability can be much better than 1% and the beam uniformity at the wafer is defined by the Gaussian profile, which is well understood. Unfortunately, the power requirements and the dwell time requirements of this approach are far too long to allow for fast recrystalization of the melted substrate.

SUMMARY OF THE DISCLOSURE

Laser annealing systems and methods for annealing a wafer with ultra-short dwell times in the range from 10 ns to 500 ns or 25 ns to 250 ns are disclosed. The laser annealing system utilize two laser beams—namely a pre-heat laser beam and a scanning laser beam—that respectively form a pre-heat line image and an annealing image that define a region of overlap. The long dimension L2 of the annealing image runs in the direction of the short dimension W1 of the pre-heat line image. Making L2 substantially larger than W1 (e.g., between 2× and 4× larger) makes it relatively easy to align the pre-heat line image and the annealing image. The pre-heat laser beam is a CW beam that operates in the infrared while the scanning laser beam is either a CW beam or a quasi-CW (QCW) beam. The scanning laser beam scans relative to the pre-heat line image and over the wafer surface sufficiently fast so that the dwell time is in the aforementioned range. These ultra-short dwell times are useful for performing melt annealing of product wafers because they prevent the device structures from reflowing. In an example, the CW and QCW nature of the scanning laser beam avoids the pulse-to-pulse uniformity problems associated with pulsed-based laser annealing systems that rely on just a one or a few light pulses to perform the annealing. In addition, adverse speckle effects are avoided since no substantial beam shaping of the QCW laser beam is required.

An aspect of the disclosure is a method of annealing a semiconductor wafer having a patterned surface with a wafer surface or subsurface temperature $T_S$ and a surface or subsurface melt temperature $T_M$. The method includes: forming a pre-heat line image on the patterned surface using a pre-heat laser beam, the pre-heat line image being configured to heat a portion of the patterned surface to a pre-anneal temperature $T_{PA}$ in the range $(0.5) \cdot T_M \leq T_{PA} \leq (0.9) \cdot T_M$, wherein the pre-heat line image has a length L1 between 5 mm and 20 mm and a width W1; forming an annealing image on the wafer surface using a scanning laser beam such that the annealing image overlaps a portion of the pre-heat line image to define a scanning overlap region, the annealing image having a length L2 in the range from 100 microns to 500 microns and a width W2 in the range from 10 microns to 50 microns, wherein the length $L2 \geq 2 \cdot W1$, and wherein the lengths L1 and L2 are measured in orthogonal directions; and scanning the annealing image relative to the pre-heat line image so that the scanning overlap region has as dwell time $T_D$ in the range $10 \text{ ns} \leq \tau_D \leq 500$ ns and locally raises the wafer surface or subsurface temperature $T_S$ from the pre-anneal temperature $T_{PA}$ to the melt temperature $T_M$ within the scanned overlap region.

Another aspect of the disclosure is the method as described above, wherein the dwell time $\tau_D$ is in the range $25 \text{ ns} \leq \tau_D \leq 250$ ns.

Another aspect of the disclosure is the method as described above, including forming the scanning laser beam by operating an anneal laser in a quasi-continuous-wave (QCW) regime that generates light pulses, wherein each point on the wafer surface over which the scanning overlap region passes receives at least 5 light pulses.

Another aspect of the disclosure is the method as described above, wherein the QCW regime has a repetition rate of 100 MHz or greater.

Another aspect of the disclosure is the method as described above, wherein the scanning laser beam is formed by directing an initial laser beam from an anneal laser to a rotating polygonal mirror.

Another aspect of the disclosure is the method as described above, wherein the pre-heat laser beam has an infrared wavelength and the scanning laser beam has a visible wavelength.

Another aspect of the disclosure is the method as described above, wherein the visible wavelength is 532 nm and is formed by frequency doubling an infrared fiber laser.

Another aspect of the disclosure is the method as described above, further including measuring the surface temperature within the scanning optical region and using the measured surface temperature to control an amount of optical power in at least one of the pre-heat and anneal laser beams.

Another aspect of the disclosure is the method as described above, wherein measuring the surface temperature includes measuring an emissivity from the scanning optical region.

Another aspect of the disclosure is the method as described above, wherein the patterned surface comprises Si and Ge.

Another aspect of the disclosure is the method as described above, including: a) using a scanning optical system, scanning the annealing image in an annealing scan direction from a start position at a proximal end of the pre-heat line image to a finish position at a distal end of the pre-heat line image; b) turning off the scanning laser beam when the annealing image reaches the finish position; c) moving the pre-heat line image to a new position on the wafer surface; d) turning back on the scanning laser beam when the annealing image can be directed to the start position; and repeating acts a) through d) to scan the scanning overlap region over substantially the entire wafer surface.

Another aspect of the disclosure is the method as described above, wherein act c) includes continuously moving the pre-heat line image in a pre-heat scan direction that is orthogonal to the annealing scan direction.

Another aspect of the disclosure is the method as described above, wherein turning off the scanning laser beam includes blocking the scanning laser beam with an acousto-optical modulator.

Another aspect of the disclosure is the method as described above, wherein the pre-heat line image heats the wafer surface or subsurface to the pre-anneal temperature $T_{PA}$ in the range $(0.6) \cdot T_M \leq T_{PA} \leq (0.8) \cdot T_M$.

Another aspect of the disclosure is a system for annealing a semiconductor wafer having a patterned surface with a wafer surface or subsurface temperature $T_S$ and a melt temperature $T_M$. The system includes: a pre-heat laser system that forms a pre-heat laser beam that forms a pre-heat line image on the patterned surface, the pre-heat line image being configured to heat a portion of the patterned surface to a pre-anneal temperature $T_{PA}$ in the range $(0.5) \cdot T_M \leq T_{PA} \leq (0.9) \cdot T_M$, wherein the pre-heat line image has a long direction with a length L1 between 5 mm and 20 mm and a narrow direction having a width W1; an annealing laser system that forms a scanned laser beam that forms an annealing image on the wafer surface such that the annealing image overlaps a portion of the pre-heat line image to define a scanning overlap region, the annealing image having a long direction with a length L2 in the range from 100 microns to 200 microns and a narrow direction having a width W2 in the range from 10 microns to 25 microns, wherein the length L2≥2·W1, and wherein the lengths L1 and L2 are measured in orthogonal directions; and wherein the annealing laser system include a scanning optical system that scans the annealing image relative to the pre-heat line image so that the scanning overlap region has as dwell time $\tau_D$ in the range 10 ns≤$\theta_D$≤500 ns and locally raises the wafer surface or subsurface temperature $T_S$ from the pre-anneal temperature $T_{PA}$ to the melt temperature $T_M$ within the scanned overlap region.

Another aspect of the disclosure is the system as described above, wherein the dwell time $\tau_D$ is in the range 25 ns≤$\tau_D$≤250 ns.

Another aspect of the disclosure is the system as described above, wherein the annealing laser system includes an anneal laser that operates in a quasi-continuous-wave (QCW) regime so that the scanning laser beam includes light pulses, wherein each point on the wafer surface over which the scanning overlap region passes receives at least 5 light pulses.

Another aspect of the disclosure is the system as described above, wherein the quasi-continuous-wave regime has a frequency of 100 MHz or greater.

Another aspect of the disclosure is the system as described above, wherein the annealing laser system includes an anneal laser that generates an initial laser beam, and wherein the scanning optical system includes a rotating polygonal mirror that receives the initial laser beam and forms the scanning laser beam.

Another aspect of the disclosure is the system as described above, wherein the laser annealing system includes a modulator operably connected to a modulator driver, wherein the modulator is arranged in the in the initial laser beam and blocks the initial laser beam when the anneal image completes its scan and transmits the initial laser beam on when the anneal image starts another scan.

Another aspect of the disclosure is the system as described above, wherein the anneal laser includes an infrared-pumped fiber laser with a frequency doubling crystal, and wherein the scanning laser beam has a wavelength of 532 nm.

Another aspect of the disclosure is the system as described above, wherein the pre-heat laser beam has an infrared wavelength.

Another aspect of the disclosure is the system as described above, further including a thermal emission detector system that measures the thermal emission from the scanning optical region.

Another aspect of the disclosure is the system as described above, wherein the wafer is supported by a chuck which in turn is supported by a moveable wafer stage, wherein the anneal image scans in an annealing direction, and wherein the wafer stage moves to scan the pre-heat line image in a pre-heat scan direction that is orthogonal to the anneal direction.

Another aspect of the disclosure is the system as described above, wherein the pre-heat line image heats the wafer surface or subsurface to the pre-anneal temperature $T_{PA}$ in the range $(0.6) \cdot T_M \leq T_{PA} \leq (0.8) \cdot T_M$.

Additional features and advantages of the disclosure are set forth in the detailed description that follows, and in part will be readily apparent to those skilled in the art from that description or recognized by practicing the embodiments as described herein, including the detailed description which follows, the claims, as well as the appended drawings. The claims constitute part of this specification, and are hereby incorporated into the detailed description by reference.

It is to be understood that both the foregoing general description and the following detailed description presented below are intended to provide an overview or framework for understanding the nature and character of the disclosure as it is claimed. The accompanying drawings are included to provide a further understanding of the disclosure, and are incorporated into and constitute a part of this specification.

The drawings illustrate various embodiments of the disclosure, and together with the description serve to explain the principles and operations of the disclosure. The claims set forth below constitute part of this specification and in particular are incorporated into the detailed description set forth below.

BRIEF DESCRIPTION OF THE DRAWINGS

For the purpose of illustrating the invention, the drawings show aspects of one or more embodiments of the invention. However, it should be understood that the present invention is not limited to the precise arrangements and instrumentalities shown in the drawings, wherein.

DETAILED DESCRIPTION

Reference is now made in detail to various embodiments of the disclosure, examples of which are illustrated in the accompanying drawings. Whenever possible, the same or like reference numbers and symbols are used throughout the drawings to refer to the same or like parts. The drawings are not necessarily to scale, and one skilled in the art will recognize where the drawings have been simplified to illustrate the key aspects of the disclosure. In some of the Figures, Cartesian coordinates are provided for the sake of reference and are not intended as providing limitations on specific directions and orientations of the systems and methods described herein. The claims as set forth below are incorporated into and constitute part of this detailed description.

In the discussion below, the term "semiconductor substrate" and "wafer" are synonymous and used interchangeably. Likewise, the terms "substrate surface" and "wafer surface" are synonymous and used interchangeably, with "substrate surface" being shorthand for "semiconductor substrate surface." The term "wafer" is shorthand for "semiconductor wafer" such as used in the fabrication of integrated circuit devices. An exemplary wafer is a silicon wafer.

Aspects of the disclosure are directed to performing melt annealing, wherein either the wafer surface locally melts or the wafer subsurface locally melts. In an example wherein the wafer surface is constituted by a thin layer of silicon overlying a layer of material with a lower melt temperature (e.g., germanium or germanium-silicon), the wafer surface can remain solid but the subsurface material can melt. Thus, the melt processes described herein can apply to the case where either the wafer surface melts, or the wafer surface remains solid but a small volume of material underneath the wafer surface melts. The latter melt process is referred to here as "subsurface" melt process, in which case the melt temperature $T_M$ refers to the melt temperature of the subsurface material. The wafer surface temperature $T_S$ substantially corresponds to the wafer subsurface temperature (i.e., the temperature just below the wafer surface) so that this temperature is also referred to as the wafer subsurface temperature in connection with the subsurface melt process.

QCW Laser Annealing System

Figure 1:
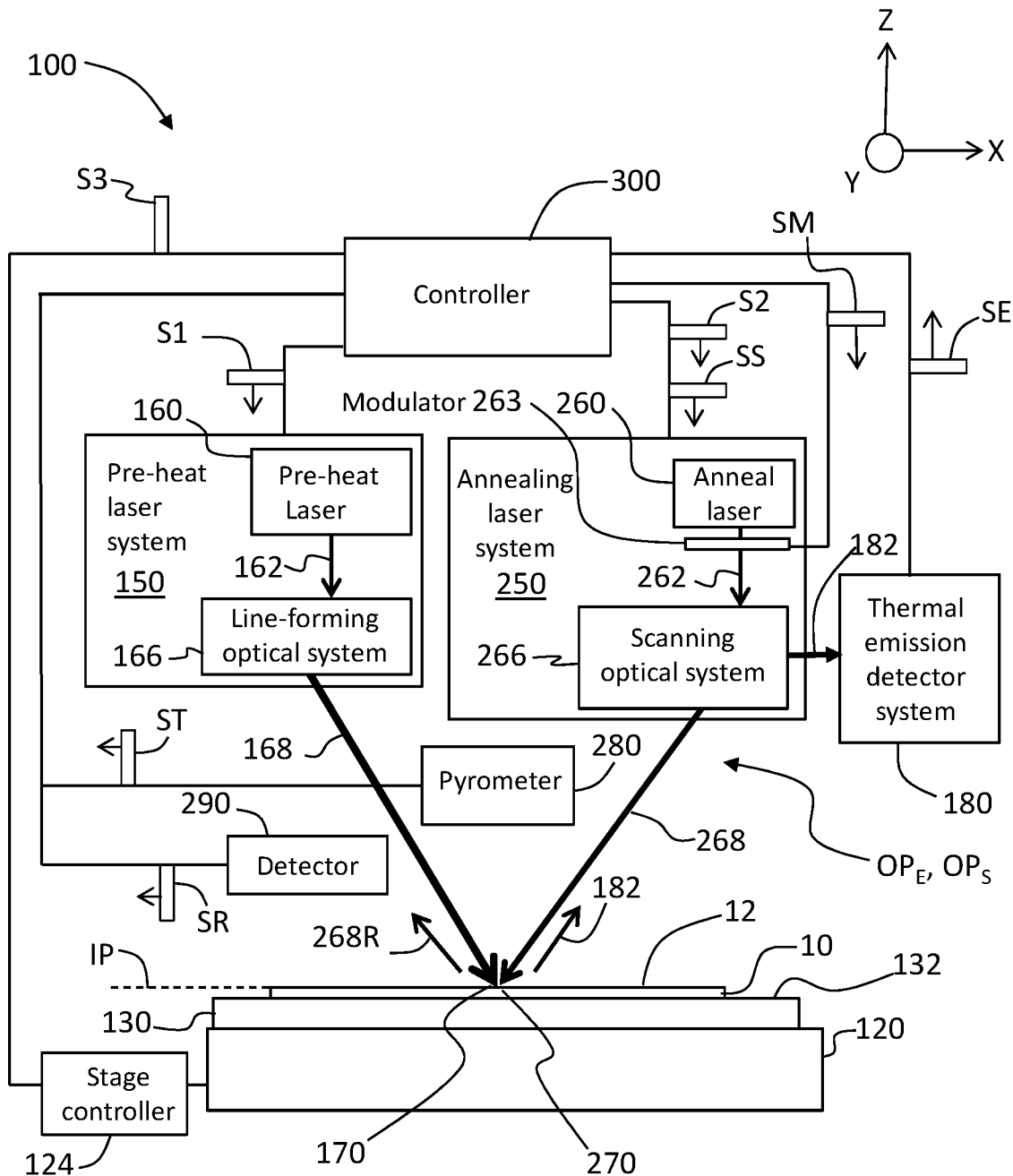
FIG. 1 is a schematic diagram of an example ultrafast laser annealing system according to the disclosure.

FIG. 1 is a schematic diagram of an example QCW laser annealing system ("system") 100 according to the disclosure. System 100 includes a wafer stage 120 that operably supports a chuck 130 having an upper surface 132. Wafer stage 120 is operably connected to a stage controller 124 and is configured to move in the X-Y plane and optionally in the Z-direction via the operation of the stage controller. Chuck upper surface 132 is configured to operably support a wafer 10 having a body 11, a surface 12, and a subsurface 13 that resides immediately below the surface, e.g., to a depth of tens of microns or so (see FIGS. 2A and 2B). The wafer surface 12 includes a pattern defined by semiconductor structures typically associated with the various stages of fabricating IC chips.

Figure 2A:
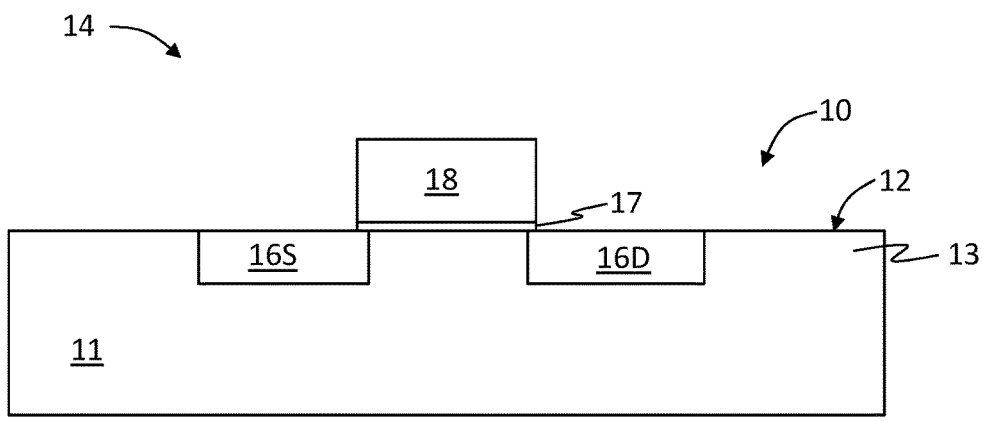
FIG. 2A is a cross-sectional view of a wafer that shows an example transistor semiconductor structure, wherein the source and drain regions can be doped Si or doped SiGe and can be annealed with a surface melt process.

FIG. 2A is a cross-sectional view of wafer 10 that shows an example transistor semiconductor structure 14. The transistor semiconductor structure 14 includes source and drain regions 16S and 16D, a thin gate-oxide layer 17, and a high-K metal gate stack 18. An example material for gate stack 18 is HfO. The source and drain regions 16S and 16D can be doped Si or doped SiGe, and can be annealed using the surface melt process as disclosed herein. The gate stack 18 has a melt temperature higher than the melt temperature of the Si or SiGe source and drain regions 16S and 16D.

Figure 2B:
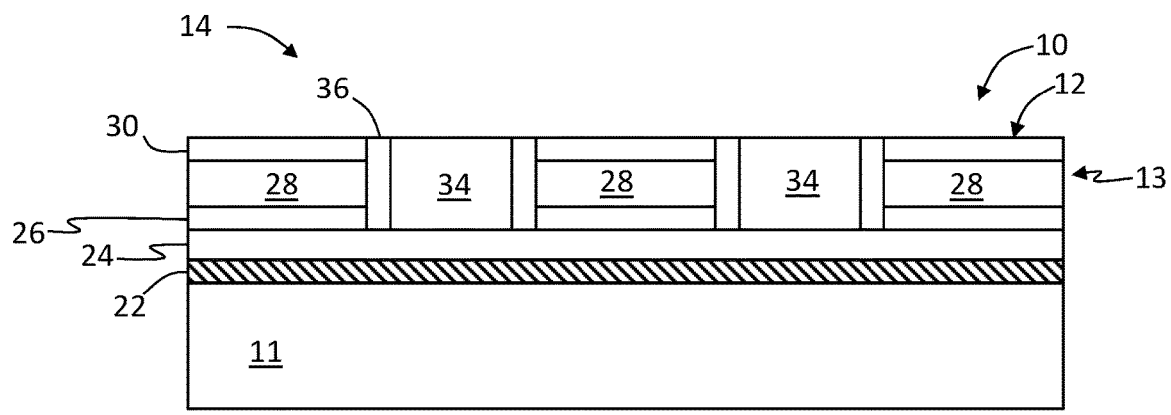
FIG. 2B is a cross-sectional view of a wafer that shows an example semiconductor structure wherein the annealing involves a subsurface melt process.

FIG. 2B is a cross-sectional view of an example wafer 10 that shows an example semiconductor structure 14 wherein the annealing process involves a subsurface melt process. The semiconductor structure 14 is based on FIG. 5 of U.S. Pat. No. 8,138,579, entitled "Structures and methods of forming SiGe and SiGeC buried layer for SOI/SiGe technology." The semiconductor structure 14 includes a buried oxide (BOX) layer 22, an Si film layer 24, an optional buffer layer of Si film 26, a SiGe or SiGeC film layer 28, a first Si epitaxial layer 30, a second Si epitaxial layer 34 and isolation structures 36.

Wafer 10 has a melt temperature $T_M$ that can vary with position on the wafer based on the various semiconductor structures formed in the wafer. For a (pure) silicon wafer 10, $T_M$=1414° C. The melt temperature $T_M$ of doped silicon may be slightly less than the pure-silicon melt temperature. In other examples such as shown in FIG. 2B, wafer 10 includes semiconductor structures 14 made of a combination of silicon and germanium. Germanium has a melt temperature of $T_M$=938° C. Semiconductor features that include both silicon and germanium have a melt temperature $T_M$ that is a weighted average of the melt temperature of the two materials. Wafer 10 also has a surface temperature $T_S$, which as noted above also refers to the subsurface temperature for a subsurface melt process.

In the example semiconductor structure 14 of FIG. 2B, the SiGe or SiGeC film layer 28 can be a doped layer that needs to be annealed to activate the dopants therein. Because the SiGe or SiGeC film layer 28 resides beneath Si layer 30, which has a higher melt temperature, the annealing process for the semiconductor structure 14 of FIG. 2B is a subsurface melt process.

In an example, chuck 130 is heated so that wafer 10 can be pre-heated. Wafer stage 120 is operably connected to stage controller 124.

System 100 also includes a pre-heat laser system 150 configured to generate a pre-heat laser beam 168. The pre-heat laser beam 168 is used to pre-heat wafer surface 12 by raising the either the wafer surface (or wafer subsurface) temperature $T_S$ to a pre-anneal temperature $T_{PA}$ that is less than the melt temperature $T_M$.

Pre-heat laser system 150 includes a pre-heat laser 160 and a line-forming optical system 166. The pre-heat laser 160 can include a diode laser, a fiber laser or a $CO_2$ laser, such as a continuous-wave (CW) p-polarized 10.6 micron $CO_2$ laser. In an example, line-forming optical system 166 is configured so that pre-heat laser beam 168 is incident wafer surface 12 at a near normal incident angle or at a large oblique incident angle. In an example embodiment, the angle of incidence of pre-heat laser beam 168 is substantially equal to the Brewster's angle for wafer surface 12, so that adverse pattern density effects from non-uniform optical absorptions are reduced or minimized.

Figure 3:
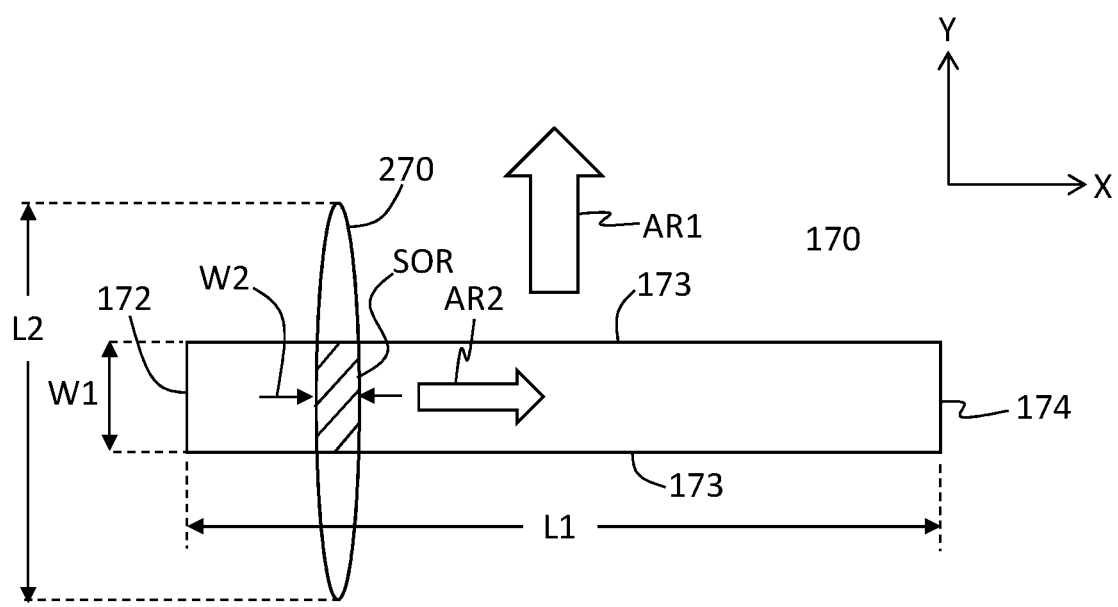
FIG. 3 is a top-down close-up view of the pre-heat line image and the annealing image formed on the wafer surface showing the relative dimensions and scan directions of the two images, and the scanning overlap region that defines the dwell time of the melt annealing process.

The line-forming optical system 166 is configured to receive an initial laser beam 162 from pre-heat laser 160 and form therefrom a pre-heat line image 170 on wafer surface 12, as shown in FIG. 3. The pre-heat line image 170 has a proximal end 172, a distal end 174, and opposite sides 173. The pre-heat line image 170 has a long direction (dimension) that runs from the proximal end 172 to distal end 174 and has a length L1. The pre-heat line image 170 also has narrow direction (dimension) measured between opposite sides 173 with a width W1. In an example, the length L1 is in the range from 5 mm to 20 mm, with an exemplary length L1 being in the range from 7 mm to 12 mm. Also in an example, width W1 is in the range from 50 μm to 200 μm, with an exemplary width W1 being 150 μm.

The pre-heat line image 170 moves relative to wafer surface 12 in the y-direction, as indicated by arrow AR1. This direction is referred to as the pre-heat scan direction. The portion of wafer surface 12 associated with pre-heat line image 170 represents a locally pre-heated portion of the wafer surface wherein the wafer surface temperature $T_S$ is raised to the pre-anneal temperature $T_{PA}$.

In an example embodiment, pre-heat laser beam 168 has a Gaussian intensity profile in the scanning direction (i.e., the y-direction), and a relatively flat top profile in the long (cross-scanning) direction (i.e., the x-direction). The beam width W1 can be defined at the $1/e^2$ intensity value of the Gaussian profile or at the full-width half-maximum (FWHM) of the Gaussian profile.

With reference again to FIG. 1, system 100 also includes an annealing laser system 250 configured to generate a scanning laser beam 268 that forms an annealing image 270 on the wafer surface 12, as shown in FIG. 3. The annealing laser system 250 includes an anneal laser 260 that emits an initial laser beam 262, a modulator 263 operably connected to a modulator driver, and a scanning optical system 266 that receives the initial laser beam and generates the scanning laser beam 268. In an example, modulator 263 is an acousto-optical modulator (AOM) that is used to selectively and alternately block and pass the initial laser beam 262 to control the scanning of annealing image 270.

The line-forming optical system 166 and scanning optical system 266 can each include lenses, mirrors, apertures, filters, active optical elements (e.g., variable attenuators, etc.) and combinations thereof. In an example, one or both of line-forming optical system 166 and scanning optical system 266 can be configured to perform beam conditioning, e.g., uniformize their respective laser beams 162 and 262 and/or provide the laser beams with a select cross-sectional shape. Example optical systems suitable for performing such beam conditioning are disclosed in U.S. Pat. Nos. 7,514,305, 7,494,942, 7,399,945 and 6,366,308. In an example, the initial laser beam 262 from anneal laser 260 has high quality (e.g., is substantially Gaussian) and is used without substantial (and in some cases, without any) beam conditioning.

Figure 4:
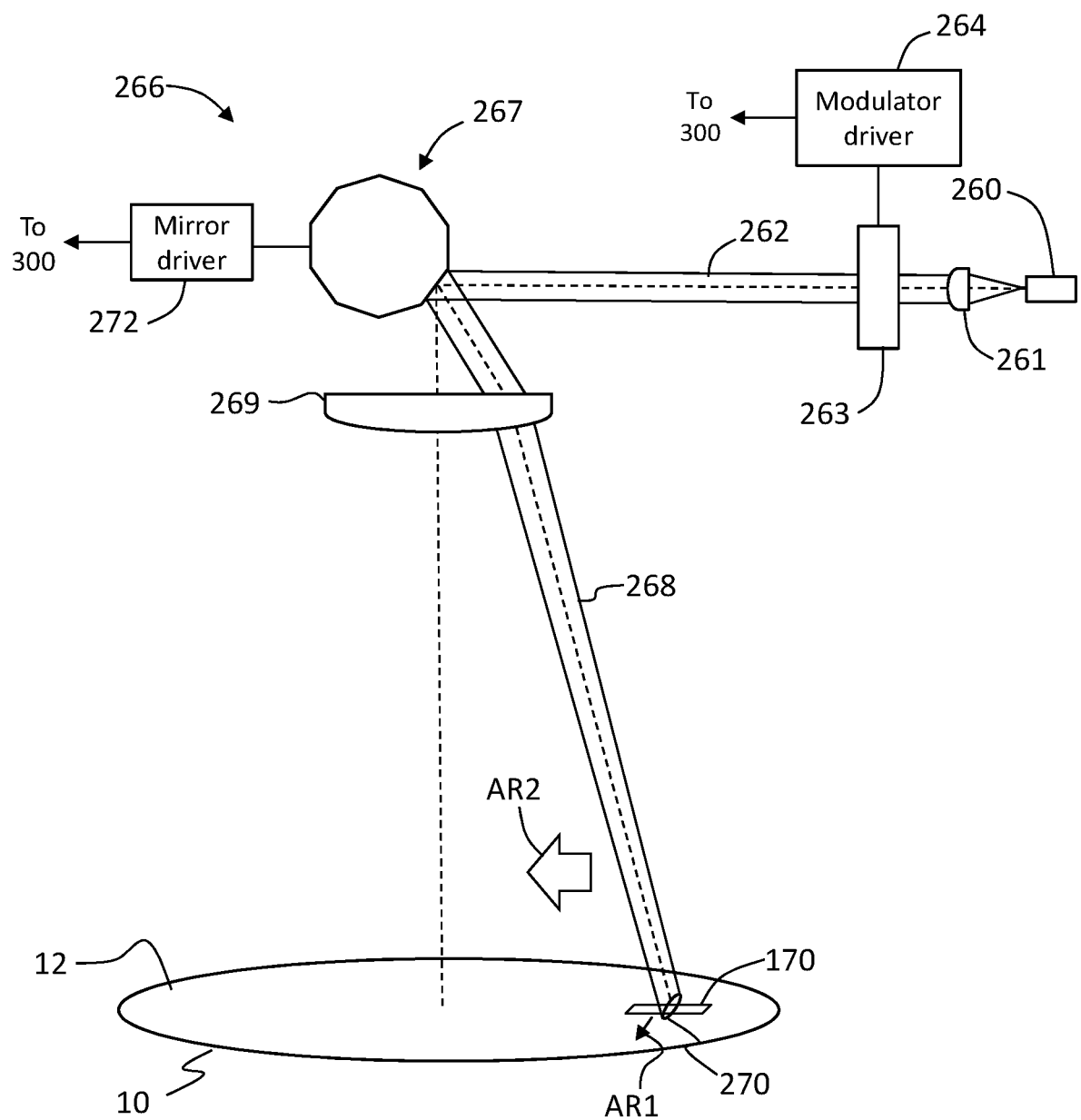
FIG. 4 is a schematic side view of an example of the annealing laser system that has a polygonal scanning mirror and an F-theta scanning configuration.

FIG. 4 is a schematic diagram of an example scanning optical system 266 that includes a collimating lens 261, a polygonal mirror 267 and a focusing lens 269. Polygonal mirror 267 is operably connected to and driven to rotate by a mirror driver 272. In one example, polygonal mirror 267 has 47 sides and rotates at a speed of about 17,000 revolutions per minute (RPM) so that the scanning of annealing image 270 relative to pre-heat line image 170 is high speed to yield ultra-short dwell times, as discussed below. In an example, scanning optical system 266 has an F-theta configuration.

In an example, anneal laser 260 is IR-diode-pumped IR laser that utilizes a frequency conversion element (e.g., frequency doubling crystal) that converts the IR wavelength to a visible wavelength, e.g., from 1.064 μm to 532 nm. In an example, the initial laser beam 262 from laser source 260 is a QCW beam, meaning that, strictly speaking, the laser emits light pulses, but the light pulses are so close together that the outputted laser beam acts very much like a CW beam.

In an example, anneal laser 260 operates in the QCW regime at a high frequency (e.g., 100 MHz or grater, or 150 MHz or greater) by simply turning the anneal laser on and off at this rate. The QCW regime gives higher peak power compared to the CW regime. The high peak power in turn makes it possible to generate the second harmonic in a simple way using a single-pass arrangement for anneal laser 260, as opposed to operating in the CW regime where a resonant cavity is needed. In an example, initial laser beam 262 is quite close to a true Gaussian, having an $M^2$ value of about 1.2. The output power of anneal laser 260 is about 500 W, and since the optical losses associated with scanning optical system 266 are relatively small, so that in an example scanning laser beam 268 has an optical power of about 500 W. The high power of scanning laser beam 268 allows for the ultra-short dwell times used in the annealing methods disclosed herein.

The scanning laser beam 268 and the associated annealing image 270 are used to add heat to the pre-heated portion of wafer surface 10 defined by pre-heat line image 170 (and optionally heated chuck 130), so that the wafer surface temperature $T_S$ locally rises from the pre-anneal temperature $T_{PA}$ up to the melt temperature $T_M$, thereby causing the wafer surface 12 or wafer subsurface 13 to locally melt.

The anneal image 270 overlaps a portion of pre-heat line image 170, and the region of overlap is referred to herein as the "scanning overlap region" SOR. The annealing image 270 has a long dimension with a length L2 and a narrow dimension with a width W2. The annealing image 270 has a substantially Gaussian intensity distribution in the x-direction and in the y-direction. The long dimension L2 of annealing image 270 is oriented in the direction of the short dimension W1 of pre-heat line image 170. In an example, the length L2 is in the range from 100 μm to 500 μm, while the width is in the range from 10 μm to 50 μm, with an exemplary width being in the range from 15 µm to 20 µm or even in the range from 16 µm to 18 µm. The scan direction AR2 of annealing image 270 perpendicular (orthogonal) to its long direction. The scan direction AR2 is referred to as the "annealing scan direction" and is in orthogonal to the "pre-heat scan direction" AR1. The width W2 of annealing image 270 defines the width of the scanning overlap region SOR in the annealing scan direction AR2.

In an example, length L2 is made substantially larger than the width W1 (e.g., between 2× and 4× larger) so that the ends of the annealing image 270 extend beyond the sides 173 of the pre-heat line image 170, as shown in FIG. 3. This makes it relatively easy to align the pre-heat line image 170 and the annealing image 270 to define the scanning overlap region SOR. This configuration utilizes the central, high-intensity portion of the annealing image 270 to add to the localized pre-heating of the wafer surface provided by the pre-heat line image 170 to bring the wafer surface temperature $T_S$ up to the melt temperature $T_M$.

The pre-heat laser beam 168 and the scanning laser beam 268 have respective wavelengths $\lambda_1$ and $\lambda_2$ that in one example are both capable of heating wafer 10 under select conditions. In an example, wavelength $\lambda_1$ is 10.64 microns and $\lambda_2$ is 532 nm.

Laser annealing system 100 also includes a thermal emission detector system 180 arranged and configured to measure an amount of thermal emission radiation 182 from wafer surface 12 as described below and generate an electrical thermal emission signal SE. In an example, thermal emission detector system 180 measures emissivity £ from wafer surface 12 and the thermal emission signal SE is representative of the measured emissivity. In an example, thermal emission detection system 180 utilizes at least a portion of scanning optical system 266 so that it can track the annealing image 270 and the scanning overlap region SOL defined thereby.

In an example embodiment, thermal emission detector system 180 and scanning optical system 266 have respective optical path sections $OP_E$ and $OP_S$ that overlap. This configuration enables the thermal emission detector system 180 to collect thermal emission radiation 182 from the location of the scanning overlap region SOL even while the annealing image 270 scans over wafer surface 12.

In another example embodiment, system 100 includes a pyrometer 280 that measures the local surface temperature $T_S$ of wafer surface 12 at the scanning overlap region SOR and generates in response a temperature signal ST.

In another example, system 100 includes a detector 290 arranged to receive light 268R that represents a portion of scanning laser beam 268 that reflects from wafer surface 12. In an example, the amount of reflected light 268R increases when the wafer surface 12 melts in the scanning overlap portion SOR (see FIG. 3). Detector 290 generates a signal SR representative of the amount of reflected light 268R it detects.

In an example embodiment, laser annealing system 100 further includes a controller 300. In an example embodiment, controller 300 is or includes a computer, such as a personal computer or workstation. Controller 300 preferably includes any of a number of commercially available microprocessors, a suitable bus architecture to connect the processor to a memory device, such as a hard disk drive, and suitable input and output devices (e.g., a keyboard and a display, respectively). Controller 300 can be programmed via instructions (software) embodied in a non-transitory computer-readable medium (e.g., memory, processor or both) that cause the controller to carry out the various functions of system 100 to effectuate annealing of wafer 10.

Controller 300 is operably connected to pre-heat laser system 150 and scanning laser system 250 and controls the operation of these systems. Controller 300 is electrically connected to modulator 263 and controls the operation of the modulator with a control signal SM. In an example, controller 300 includes digital signal processors (DSPs) (not shown) to control scanning functions in the pre-heat and scanning laser systems 150 and 250. Controller 300 is also operably connected to thermal emission detection system 180 and scanning optical system 266 and is configured to receive and process thermal emission signal SE. Controller 300 is also operably connected to pyrometer 280 and is configured to receive and process the temperature signal ST as described below. Controller 300 is also operably connected to detector 290 and is configured to receive and process the reflected-light signal SR.

In an example of the operation of system 100, system controller 300 sends a first control signal 51 to pre-heat laser 160, which in response thereto generates initial laser beam 162. This initial laser beam 162 is received by optical system 166, which forms therefrom pre-heat laser beam 168, which travels generally along first optical axis A1 and forms pre-heat line image 170 at wafer surface 12.

System controller 300 also sends as second control signals S2 to anneal laser 260, which in response thereto generates initial laser beam 262. This initial laser beam 262 is received by scanning optical system 266, which is controlled by a control signal SS to form scanning laser beam 268, which in turn forms annealing image 270 at wafer surface 12.

System controller 300 also sends a third control signals S3 to stage controller 124 to cause the controlled movement of stage 120 to move (scan) wafer 10 relative to the pre-heat line image 170 and annealing image 270. In an example where chuck 130 provides wafer pre-heating, system controller 300 may also send another control signal (not shown) to chuck controller 134 to initiate the wafer pre-heating process. Typical chuck pre-heating ranges are from room temperature (25° C.) to 400° C.

In an example, system controller 300 also receives temperature signal ST from pyrometer 280 and uses this temperature signal to control the intensity of one or both of pre-heat laser beam 168 and scanning laser beam 268.

Figure 5:
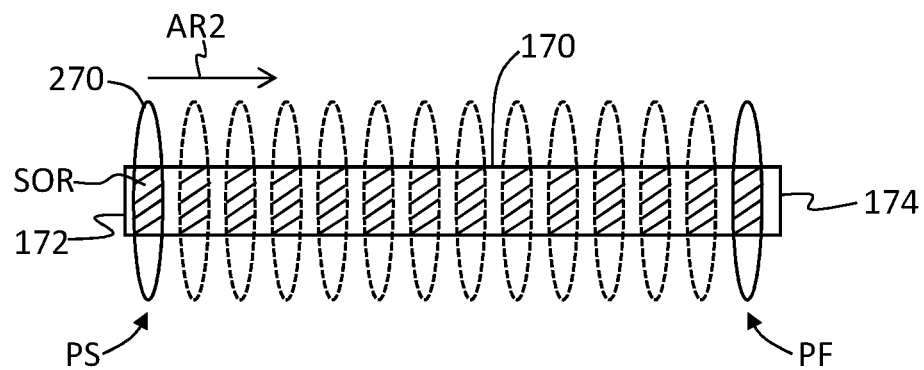
FIG. 5 is a close-up view similar to FIG. 3 illustrating the scanning movement of the annealing image and the scanning overlap region relative to the pre-heat line image.

FIG. 5 is a close-up view similar to FIG. 3 illustrating the scanning movement of the annealing image 270 and the scanning overlap region SOR relative to the pre-heat line image. The annealing image 270 is shown at various positions corresponding to different times during the scanning process. The scanning optical system 266 is configured to scan or sweep annealing image 270 in the x-direction over pre-heat line image 170 from a start position PS at proximal end 172 of the pre-heat line image to a finish position PF at distal end 174 of the pre-heat line image. The scanning speed of annealing image 270 is sufficiently rapid as compared to the movement of the pre-heat line image 170 such that the pre-heat line image is essentially stationary during the scanning of the annealing image.

In one example, the dwell time $\tau_D$ of the scanning overlap region SOR is in the range 10 ns$\leq\tau_D\leq$500 ns, while in another example is in the range 25 ns$\leq T_D\leq$250 ns. For a width W2=15 µm and a dwell time of 25 ns, the scanning speed of annealing image 170 and thus the scanning overlap region SOR is $v_S$=W2/$\tau_D$=600 m/s. For a dwell time $\tau_D$ of 250 ns, the scanning speed is $v_S$=60 m/s. For a dwell time $\tau_D$ of 500 ns, the scanning speed is $v_S$=30 m/s. For a dwell time $\tau_D$ of 10 ns, the scanning speed is 1500 m/s. These scanning speeds are achievable with the scanning optical system 266 such as shown in FIG. 3.

Figure 6:
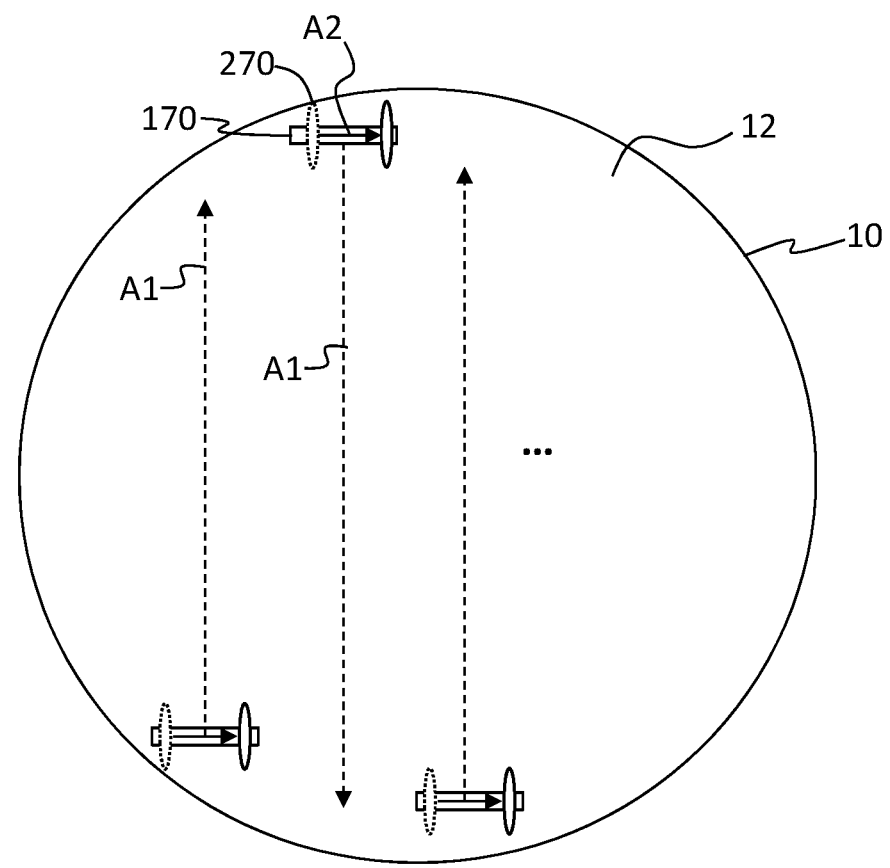
FIG. 6 is a top-down view of the wafer illustrating an example method of scanning of the wafer surface with the pre-heat line image and the annealing image.

Once annealing image 270 reaches the distal end 174 of pre-heat line image 170, the scanning beam 268 and corresponding annealing image 270 are turned off by activating modulator 263 so that is blocks the transmission of initial laser beam 262. While the scanning beam 168 is "off," the pre-heat line image 170 is allowed to move in the y-direction so that the next portion of wafer surface 12 can be scanned. In an example, the movement of pre-heat line image 170 may be continuous, e.g., by continuously moving stage 120. Once the pre-heat line image 170 is in place, the scanning beam 168 is turned back on by placing the modulator 263 in the transmission mode when the scanning optical system 166 can direct the scanning laser beam 268 and the corresponding annealing image 270 to the start position PS of the newly located pre-heat line image 170. Then the scanning of annealing image 270 over the newly located pre-heat line image 170 is carried out. FIG. 6 is a top-down view of wafer 10 illustrating an example method of scanning of substantially the entire wafer surface 12 (e.g., at least the patterned portions) with the scanning overlap region SOL by repeating the above-described scanning method.

As noted above, in an example, anneal laser 260 is operated in the QCW regime. An example frequency of operation for anneal laser 260 is f=100 MHz or greater, orf=150 MHz or greater. A frequency f=150 MHz results in anneal laser 260 generating $150 \times 10^6$ light pulses per second. For a scan speed $v_S$=150 m/s of scanning beam 168, this translates into a pulse per distance rate $R_p$=f/$v_S$=1 pulse (p) for every micron of distance that the anneal image 270 travels, i.e., 1 p/μm. The dwell time $\tau_D$ is the amount of time it takes for width W2 of annealing image and scanning overlap region SOL to pass over a given point on the wafer 12. Thus, for an annealing image 260 that has a width W2=15 μm and that moves over a given point on the wafer surface 12 at $v_S$=150 m/s, that point will experience a number of pulses Np=$R_p$·W2=(1 p/μm)·(15 μm)=15 pulses. For a scan speed of 600 m/s and a width W2=20 μm, the pulse rate per distance Rp=f/$v_S$=0.5p/μm, so that the number of pulses $N_p$=$R_p$·W2=(0.5p/μm)·(20 μm)=10 pulses.

In an example, each point on the wafer surface 12 over which the scanning overlap region SOR is scanned is subjected to at least 5 light pulses from scanning laser beam 268, and preferably at least 8 light pulses, and more preferably at least 10 light pulses over the duration of the dwell time $\tau_D$. The frequency of the pulses is sufficiently fast (e.g., faster than 100 ns) such that recrystallization does not take place at the given point associated with wafer surface 12 (or subsurface 13) during irradiation of the given point by the pulses.

In an example, the melt-anneal process is carried out by system 100 such that the pre-anneal temperature $T_{PA}$ is in the range $(0.5) \cdot T_M \leq T_{PA} \leq (0.9) \cdot T_M$, while in another example the pre-anneal temperature is in the range from $(0.6) \cdot T_M \leq T_{PA} \leq (0.8) \cdot T_M$, while in another example the pre-anneal temperature is in the range from $(0.6) \cdot T_M \leq T_{PA} \leq (0.7) \cdot T_M$. As noted above, the melt temperature $T_M$ can refer to either the surface melt temperature or the subsurface melt temperature, depending on the application.

During the scanning process, thermal emission detection system 180 can be used to monitor the thermal emission radiation 182 from the scanning overlap region SOR. The thermal emission detection system 180 generates thermal emission signal SE representative of the detected thermal emission and sends this signal to controller 300. Controller 300 receives the thermal emission signal SE and uses this signal to create a feed-back loop that controls the amount of power generated by at least one of the pre-heat and annealing laser systems 150 and 250 to control the laser power in at least one of the pre-heat laser beam 168 and the scanning laser beam 268 so that the wafer surface temperature $T_S$ remains substantially constant. The detection of thermal emission radiation 182 can be accomplished using a fast photodetector so that the corresponding thermal emission signal $S_E$ is essentially immediately available for closed-loop control.

To accurately control the wafer surface temperature $T_S$ of wafer surface 12, one needs to be able to measure it accurately as the annealing method is being carried out. Systems and methods applicable to the present disclosure for measuring wafer surface temperature $T_S$ by measuring the emissivity e are described in U.S. Patent Pub. No. 2012/0100640. The emissivity ε can be calculated on a point-by-point basis as scanning overlap region SOR scans over wafer surface 12. The calculated emissivity c is then employed to obtain a local measurement of the wafer surface temperature $T_S$, which is insensitive to emissivity variations due to any pattern present on wafer surface 12. This in turn allows for closed-loop control of the amount of power scanning laser beam 268. The measurement of reflected light 268R also serves a method of providing feedback to system 100 to control the amount of optical power in one or both of pre-anneal and scanning laser beams 168 and 268.

It will be apparent to those skilled in the art that various modifications and variations can be made to the present disclosure without departing from the spirit and scope of the disclosure. Thus it is intended that the present disclosure cover the modifications and variations of this disclosure provided they come within the scope of the appended claims and their equivalents.

Exemplary embodiments have been disclosed above and illustrated in the accompanying drawings. It will be understood by those skilled in the art that various changes, omissions and additions may be made to that which is specifically disclosed herein without departing from the spirit and scope of the present invention.

What is claimed is:

1. A method of annealing a semiconductor wafer having a patterned surface with a wafer surface or subsurface temperature $T_S$ and a surface or subsurface melt temperature $T_M$, comprising:

forming a pre-heat line image on the patterned surface using a pre-heat laser beam, the pre-heat line image being configured to heat a portion of the patterned surface to a pre-anneal temperature $T_{PA}$ in the range $(0.5) \cdot T_M \leq T_{PA} \leq (0.9) \cdot T_M$, wherein the pre-heat line image has a length L1 between 5 mm and 20 mm and a width W1;

forming an annealing image on the wafer surface using a scanning laser beam such that the annealing image overlaps a portion of the pre-heat line image to define a scanning overlap region, the annealing image having a length L2 in the range from 100 microns to 500 microns and a width W2 in the range from 10 microns to 50 microns, wherein the length L2≥2·W1, and wherein the lengths L1 and L2 are measured in orthogonal directions; and scanning the annealing image relative to the pre-heat line image so that the scanning overlap region has as dwell time $\tau_D$ in the range 10 ns≤$\tau_D$≤500 ns and locally raises the wafer surface or subsurface temperature $T_S$ from the pre-anneal temperature $T_{PA}$ to the melt temperature $T_M$ within the scanned overlap region.

2. The method according to claim 1, wherein the dwell time $\tau_D$ is in the range of 25 ns≤$\tau_D$≤250 ns.

3. The method according to claim 1, including forming the scanning laser beam by operating an anneal laser in a quasi-continuous-wave (QCW) regime that generates light pulses, wherein each point on the wafer surface over which the scanning overlap region passes receives at least 5 light pulses.

4. The method according to claim 3, wherein the QCW regime has a repetition rate of 100 MHz or greater.

5. The method according to claim 1, wherein the scanning laser beam is formed by directing an initial laser beam from an anneal laser to a rotating polygonal mirror.

6. The method according to claim 1, wherein the pre-heat laser beam has an infrared wavelength and the scanning laser beam has a visible wavelength.

7. The method according to claim 6, wherein the visible wavelength is 532 nm and is formed by frequency doubling an infrared fiber laser.

8. The method according to claim 1, further including measuring the surface temperature within the scanning overlap region and using the measured surface temperature to control an amount of optical power in at least one of the pre-heat and anneal laser beams.

9. The method according to claim 8, wherein measuring the surface temperature includes measuring an emissivity from the scanning overlap region.

10. The method according to claim 1, wherein the patterned surface comprises Si and Ge.

11. The method according to claim 1, including:
a) using a scanning optical system, scanning the annealing image in an annealing scan direction from a start position at a proximal end of the pre-heat line image to a finish position at a distal end of the pre-heat line image;
b) turning off the scanning laser beam when the annealing image reaches the finish position;
c) moving the pre-heat line image to a new position on the wafer surface;
d) turning back on the scanning laser beam when the annealing image can be directed to the start position; and
repeating acts a) through d) to scan the scanning overlap region over substantially the entire wafer surface.

12. The method according to claim 11, wherein act c) includes continuously moving the pre-heat line image in a pre-heat scan direction that is orthogonal to the annealing scan direction.

13. The method according to claim 11, wherein turning off the scanning laser beam includes blocking the scanning laser beam with an acousto-optical modulator.

14. The method according to claim 11, wherein the pre-heat line image heats the wafer surface or subsurface to the pre-anneal temperature $T_{PA}$ in the range $(0.6) \cdot T_M \leq T_{PA} \leq (0.8) \cdot T_M$.

* * * * *